United States Patent
Yoo et al.

(10) Patent No.: US 7,101,776 B2
(45) Date of Patent: Sep. 5, 2006

(54) METHOD OF FABRICATING MOS TRANSISTOR USING TOTAL GATE SILICIDATION PROCESS

(75) Inventors: Jae-Yoon Yoo, Seoul (KR); Hwa-Sung Rhee, Seongnam-si (KR); Ho Lee, Gyeonggi-do (KR); Seung-Hwan Lee, Seoul (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/806,301

(22) Filed: Mar. 22, 2004

(65) Prior Publication Data

US 2005/0009265 A1 Jan. 13, 2005

(30) Foreign Application Priority Data

Jul. 10, 2003 (KR) ...................... 10-2003-0046983

(51) Int. Cl.
*H01L 21/44* (2006.01)
*H01L 21/3205* (2006.01)
*H01L 21/4763* (2006.01)

(52) U.S. Cl. ...................... 438/592; 438/595; 438/655

(58) Field of Classification Search ................ 438/592, 438/595, 655, 201, 218, 685, 682
See application file for complete search history.

(56) References Cited

U.S. PATENT DOCUMENTS 6,362,063 B1 * 3/2002 Maszara et al. ............ 438/301
6,518,155 B1 * 2/2003 Chau et al. ................. 438/592

OTHER PUBLICATIONS

Tavel, B., et al., "Totally Silicided (CoSi$_2$) Polysilicon: a novel approach to very low-resistive gate (~Ω/□) without metal CMP nor etching," *IEDM 2001*, p. 825-828, Dec. 2001.

* cited by examiner

*Primary Examiner*—Walter L. Lindsay, Jr.
(74) *Attorney, Agent, or Firm*—Mills & Onello LLP

(57) ABSTRACT

There is provided a method of fabricating a MOS transistor using a total gate silicidation process. The method includes forming an insulated gate pattern on a semiconductor substrate. The insulated gate pattern includes a silicon pattern and a sacrificial layer pattern, which are sequentially stacked. Spacers covering sidewalls of the gate pattern are formed, and source/drain regions are formed by injecting impurity ions into the semiconductor substrate using the spacers and the gate pattern as ion injection masks. The silicon pattern is exposed by removing the sacrificial layer pattern on the semiconductor substrate having the source/drain regions. The exposed silicon pattern is fully converted into a gate silicide layer, and concurrently a source/drain silicide layer is selectively formed on the surface of the source/drain regions.

99 Claims, 3 Drawing Sheets

METHOD OF FABRICATING MOS TRANSISTOR USING TOTAL GATE SILICIDATION PROCESS

CROSS-REFERENCE TO RELATED APPLICATION

This application claims the benefit of Korean Patent Application No. 2003-46983 filed on Jul. 10, 2003, the contents of which are hereby incorporated herein by reference in their entirety.

BACKGROUND OF THE INVENTION

1. Field of the Invention

The present invention relates to a method of fabricating semiconductor devices, and more particularly to a method of fabricating a MOS transistor using a total gate silicidation process.

2. Description of the Related Art

MOS transistors are widely in use as discrete switching devices in semiconductor devices. With the increase in integration of semiconductor devices, the size of the MOS transistor has been reduced. As a result, the reduction in the channel length of the MOS-transistor causes a short channel effect.

The junction depth of the source/drain region of the MOS transistor is required to be reduced to improve the short channel effect. The reduction of the junction depth of the source/drain region increases the sheet resistance of the source/drain region, which results in a decreased ability to provide an appropriate driving current required in a high performance transistor. Therefore, a self-aligned silicide process is widely used in order to decrease the sheet resistance of the source/drain region, and to reduce the sheet resistance of the gate electrode.

The self-aligned silicide process has been developed and widely used to form a silicide layer at the source/drain region and on top of the polysilicon of the gate region at the same time. In accordance with this process, the thickness of the silicide layer formed at the source/drain region should be smaller than the junction depth.

Also, with the MOS transistor scaled down, the thickness (Tox) of the gate insulating layer has been reduced to avoid the short channel effect and improve the current drivability. The reduction of the thickness of the gate insulating layer increases the capacitance of the gate insulating layer so as to improve the current drivability.

However, as a result of the reduction of the thickness of the gate insulating layer, poly depletion occurs in the MOS transistor, in which a polysilicon layer is used as a gate electrode. The poly depletion layer increases the electrical equivalent thickness of the gate insulating layer, and decreases the drive current.

As a method of solving the poly depletion problem, use of a metal gate has been widely studied. However, the metal gate has a drawback in the form of a difficulty in controlling threshold voltage of a transistor. Specifically, the threshold voltages of the NMOS transistor region and the PMOS transistor region should be controlled in order to employ the metal gate in a CMOS transistor. However, the use of a different metal gate in each MOS transistor makes the fabrication processes too complicated to be practicably employed.

One method for solving the problems of poly depletion and the metal gate is taught by Tavel et. al. in a research paper entitled, "Totally Silicided ($CoSi_2$) Polysilicon: a novel approach to very low-resistive gate (~$2\Omega/\square$) without metal CMP nor etching," (IEDM 2001, p.825–828, December of 2001).

However, the method disclosed in the above paper also has a drawback in that a threshold voltage ($V_{th}$) is increased due to a decrease of the absolute value of a flat band voltage ($V_{fb}$) since a midgap material is used as a metal gate, and that the fabrication processes are complicated since the silicide layer of the source/drain region and the gate silicide layer are formed respectively using separate processes. Specifically, in order to form the silicide layer of the source/drain region and the gate silicide layer using separate proecsses, a chemical mechanical polishing process (CMP) is required.

In order to concurrently form the silicide layer of the source/drain region and the gate silicide layer using the total gate silicide process, it is necessary to reduce the gate height. However, when the gate height is even slightly reduced, ions are injected into a channel region during the ion implantation process into the source/drain regions, which causes a problem that leakage current of the MOS transistor is increased.

As a result, it is necessary to optimize the fabrication method of the MOS transistor being capable of solving the poly depletion problem.

SUMMARY OF THE INVENTION

The present invention provides a method of fabricating a MOS transistor and a CMOS transistor in which a silicide layer of source/drain regions and a gate silicide layer are formed concurrently. In accordance with the invention, ions are prevented from being injected into a channel region during an implantion of source/drain ions.

The present invention also provides a method of fabricating a MOS transistor and a CMOS transistor capable of maintaining a low threshold voltage with use of a metal gate.

The present invention is directed to a method of fabricating a MOS transistor using a total gate silicidation process. The method includes forming an insulated gate pattern on a semiconductor substrate. The insulated gate pattern may include a silicon pattern and a sacrificial layer pattern, which are sequentially stacked. Spacers covering sidewalls of the gate pattern are formed, and impurity ions are injected into the semiconductor substrate using the spacers and the gate pattern as ion injection masks to form source/drain regions. The sacrificial layer pattern on the semiconductor substrate having the source/drain regions is removed to expose the silicon pattern. The exposed silicon pattern is converted into a gate silicide layer, and source/drain silicide layers are concurrently selectively formed at surfaces of the source/drain regions.

The formation of the insulated gate pattern may include sequentially forming a gate insulating layer and a silicon layer on the semiconductor substrate. A sacrificial layer is formed on the semiconductor substrate having the silicon layer. The sacrificial layer and the silicon layer are patterned sequentially to form the silicon pattern and the sacrificial layer pattern.

Before or after forming the sacrificial layer, the silicon layer may be doped with impurities to control a threshold voltage. The impurities are N-type or P-type according to types of the MOS transistor. That is, in the case of fabricating an NMOS transistor, the silicon layer is doped with N-type impurities, and in the case of fabricating a PMOS transistor, the silicon layer is doped with P-type impurities. Further, before doping the silicon layer with the impurities, a buffer layer may be formed on the silicon layer. The buffer layer may be used to prevent the impurities from penetrating into the semiconductor substrate under the gate insulating layer in a technology of implanting impurity ions using high energy. In this case, the buffer layer is etched to form a buffer layer pattern before patterning the silicon layer, and the buffer layer pattern is removed along with the sacrificial layer pattern to expose the silicon pattern.

Before forming the spacers, impurity ions may be injected into the semiconductor substrate using the gate pattern as an ion injection mask to form an LDD and a halo in order to prevent a short channel effect and a hot carrier effect. Further, in order to prevent a short channel effect, before forming the LDD and the halo, offset spacers may be formed. The offset spacers prevent the occurrence of the short channel effect by increasing the channel length.

The silicide layers may be formed by forming a metal layer on the semiconductor substrate having the exposed silicon pattern, and annealing the metal layer until the exposed silicon pattern is silicided. After the silicide layers are formed, the unreacted portion of the metal layer remaining on the spacers is removed in order to electrically insulate the gate silicide layer and the source/drain silicide layer.

In one embodiment, the semiconductor substrate is a single crystal silicon substrate, a silicon-on-insulator (SOI) substrate, or a strained silicon substrate.

The spacers can be formed of an insulating layer having an etch selectivity with respect to the sacrificial layer pattern. The insulating layer having the etch selectivity is composed of multiple layers including a silicon oxide layer and a silicon nitride layer. The metal layer can include at least one metal layer or alloy layer including metals selected from the group consisting of Ni, Co, W, and Ti. The metal layer can be a nickel layer or a nickel alloy layer.

In one embodiment, a selective epitaxial growth layer is formed on the source/drain regions before removing the sacrificial layer pattern. In accordance with another aspect, the present invention provides a method of fabricating a CMOS transistor. The method includes defining an NMOS transistor region and a PMOS transistor region on a predetermined portion of a semiconductor substrate, and forming insulated gate patterns on the NMOS transistor region and the PMOS transistor region. Each of the insulated gate patterns may include a silicon pattern and a sacrificial layer pattern, which are sequentially stacked. Spacers covering the sidewalls of the gate patterns are formed, and impurity ions are injected into the NMOS transistor region and the PMOS transistor region using the gate patterns and the spacers as ion injection masks to form source/drain regions. N-type source/drain regions are formed in the NMOS transistor region, and P-type source/drain regions are formed in the PMOS transistor region. By removing the sacrificial layer patterns on the semiconductor substrate having the source/drain regions, the silicon patterns are exposed, and the exposed silicon patterns are converted into gate silicide layers, and source/drain silicide layers are concurrently selectively formed at the surface of the source/drain regions.

The formation of the gate patterns can include sequentially forming a gate insulating layer and a silicon layer on the semiconductor substrate. A sacrificial layer is formed on the semiconductor substrate having the silicon layer, and the sacrificial layer and the silicon layer are patterned sequentially to form the silicon patterns and the sacrificial layer patterns.

Before or after forming the sacrificial layer, the silicon layer on the upper portion of the NMOS transistor region and the PMOS transistor region may be doped with impurities to control threshold voltages. In this case, the silicon layer on the upper portion of the NMOS transistor region may be doped with N-type impurities, and the silicon layer on the upper portion of the PMOS transistor region may be doped with P-type impurities. Further, before doping the silicon layer, a buffer layer may be formed on top of the silicon layer. The buffer layer can be etched to form buffer layer patterns before patterning the silicon layer, and the buffer layer patterns can be removed along with the sacrificial layer patterns in order to expose the silicon patterns.

Before forming the spacers, impurity ions may be injected into the NMOS transistor region and the PMOS transistor region of the semiconductor substrate having the gate patterns to form LDDs and halos. Further, before forming the LDDs and the halos, there may be formed offset spacers.

In one embodiment, the semiconductor substrate is a single crystal silicon substrate, a silicon-on-insulator (SOI) substrate, or a strained silicon substrate.

The spacers can be formed of an insulating layer having an etch selectivity with respect to the sacrificial layer patterns. The insulating layer having the etch selectivity is composed of multiple layers including a silicon oxide layer and a silicon nitride layer.

In one embodiment, converting the exposed silicon patterns into gate silicide layers and concurrently forming source/drain silicide layers selectively, comprises: i) forming a metal layer on the semiconductor substrate having the exposed silicon patterns; ii) annealing the metal layer until the exposed silicon patterns are totally silicided; and iii) removing the unreacted metal layer remaining on the spacers. The metal layer can be at least one metal layer or an alloy layer of a metal selected from the group consisting of Ni, Co, W, and Ti. The metal layer can be a nickel layer or a nickel alloy layer.

In one embodiment, a selective epitaxial growth layer is formed on the source/drain regions before removing the sacrificial layer pattern.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DETAILED DESCRIPTION OF THE INVENTION

Figure 1:
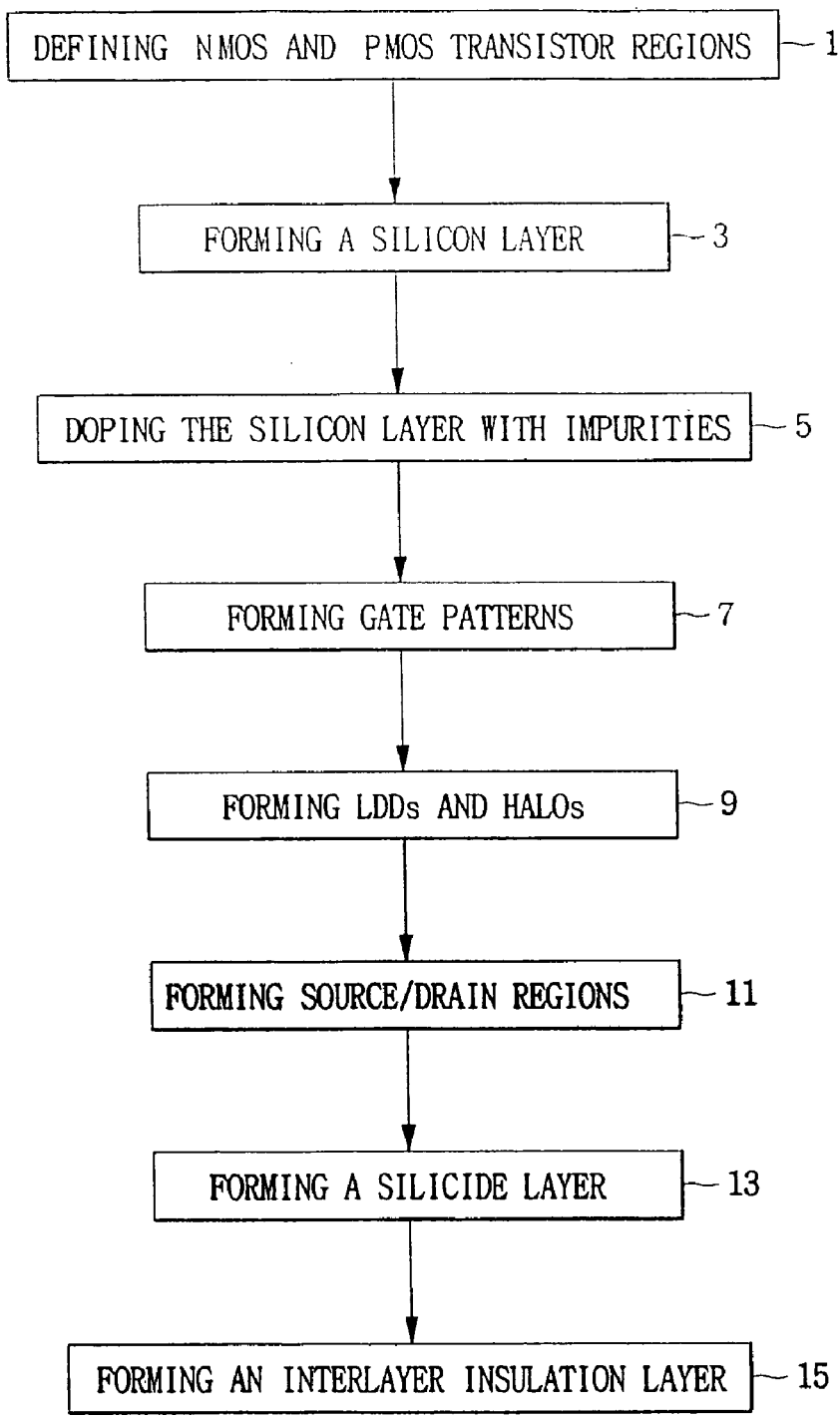
FIG. 1 is a process flow chart illustrating a method of fabricating a CMOS transistor according to one embodiment of the present invention.

The present invention will now be described more fully hereinafter with reference to the accompanying drawings, in which preferred embodiments of the invention are shown. In the drawings, the thicknesses of layers and regions are exaggerated for clarity.

FIG. 1 is a process flow chart illustrating a method of fabricating a CMOS transistor according to one embodiment of the present invention, and FIGS. 2 to 7 are sectional views illustrating a method of fabricating a CMOS transistor according to one embodiment of the present invention. In FIGS. 2 to 7, the reference numeral A represents an NMOS transistor region, and the reference numeral B represents a PMOS transistor region.

Figure 2:
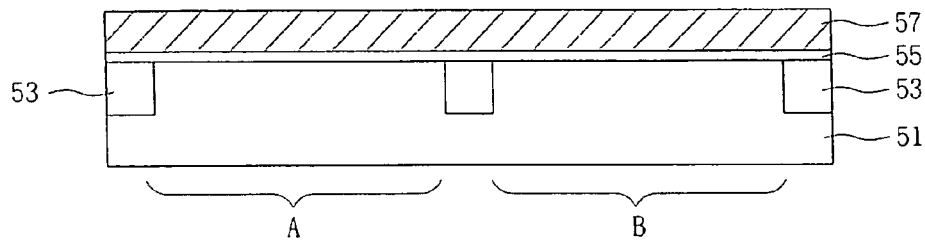
FIGS. 2 to 7 are sectional views illustrating a method of fabricating a CMOS transistor according to one embodiment of the present invention.

Referring to FIGS. 1 and 2, a device isolation layer 53 is formed in a predetermined portion of a semiconductor substrate 51 to define active regions. The semiconductor substrate 51 may be a single crystal silicon substrate, a silicon-on-insulator (SOI) substrate, or a strained silicon substrate. In the case of a CMOS transistor, an NMOS transistor region A and a PMOS transistor region B are defined (step 1 of FIG. 1). The NMOS transistor region A and the PMOS transistor region B may be defined by forming wells, but a fully depleted SOI (FDSOI) substrate does not require the formation of wells. In the illustrated embodiment, P-type impurities are injected to form wells in the NMOS transistor region A, and N-type impurities are injected to form wells in the PMOS transistor region B.

A gate insulating layer 55 and a silicon layer 57 are sequentially formed on the semiconductor substrate having the active regions (step 3 of FIG. 1). The gate insulating layer 55 is preferably formed of a silicon oxide ($SiO_2$) layer.

The silicon layer 57 can be formed of a polysilicon layer or an amorphous silicon layer, and in order to fabricate a CMOS transistor, it is preferable to form an undoped silicon layer. Further, in order to reduce the gate height, the silicon layer 57 is preferably formed with a thickness of 100 Å to 600 Å.

Figure 3:
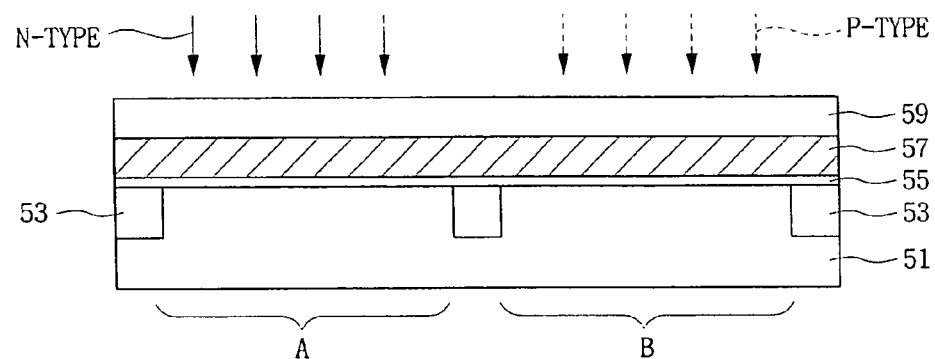

Referring to FIGS. 1 and 3, the silicon layer 57 may be doped with impurities to control a threshold voltage ($V_{th}$) (step 5 of FIG. 1). When the silicon layer 57 is fully converted into a metal silicide layer, the impurities function to control the surface workfunction of the metal silicide layer to control the threshold voltage.

The doping of the impurities can be performed using a plasma doping technology or a high energy ion implantation technology. That is, by using a mask, the silicon layer 57 on top of the NMOS transistor region A is doped with N-type impurities, and the silicon layer 57 on top of the PMOS transistor region B is doped with P-type impurities.

Herein, the doping impurities are opposite types to the impurities in the well formed on the semiconductor substrate under the gate insulating layer 55. Therefore, the impurities injected to dope the silicon layer 57 should be prevented from penetrating through the gate insulating layer 55. It is preferable to form a buffer layer 59 on the silicon layer 57 before doping with the impurities using the high energy ion implantation technology. The buffer layer 59 can be formed of SiN or SiON, and preferably, it is formed of a silicon nitride (SiN) layer. The buffer layer 59 is formed with an appropriate thickness with consideration of a penetration depth of implanted ions.

Figure 4:
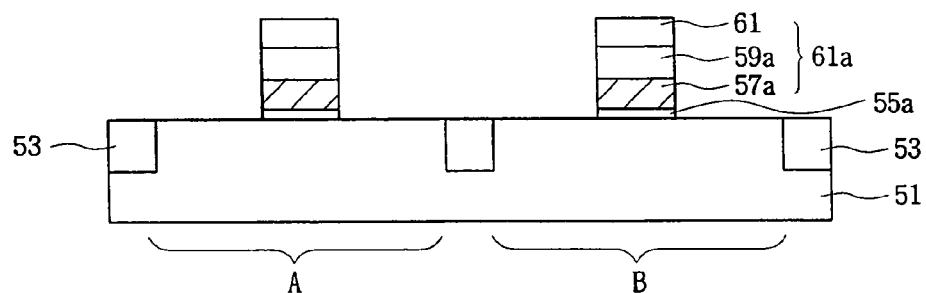

Referring to FIGS. 1 and 4, after doping the silicon layer 57 with the impurities, a sacrificial layer is formed on the buffer layer 59. The sacrificial layer is formed of SiN or SiON, and preferably, it is formed of a silicon nitride (SiN) layer.

The buffer layer 59 and the sacrificial layer function as masks in a subsequent source/drain ion implantation process, and prevent impurities from penetrating into gate channel regions. Therefore, in the case that the buffer layer 59 is thick enough, it is not necessary to form the sacrificial layer. In the case that no sacrificial layer is formed, the buffer layer 59 will be referred to as a sacrificial layer.

The sacrificial layer, the buffer layer 59, and the silicon layer 57 in the NMOS transistor region A and the PMOS transistor region B are patterned sequentially to form gate patterns 61a including silicon patterns 57a, buffer layer patterns 59a, and the sacrificial layer patterns 61 (step 7 of FIG. 1). Herein, the gate insulating layer 55 can also be patterned so as to form gate insulating layer patterns 55a.

Figure 5:
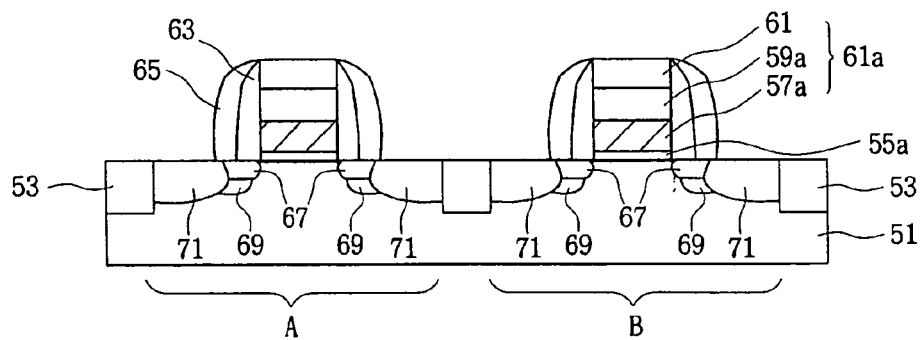

Referring to FIGS. 1 and 5, using the gate patterns 61a as ion injection masks, impurities ions are injected into the NMOS transistor region A and the PMOS transistor region B on the semiconductor substrate 51, so as to form lightly-doped drains (LDDs) 67, and halos 69 (step 9 of FIG. 1).

The LDDs 67 are formed by injecting N-type impurities into the NMOS transistor region A and P-type impurities into the PMOS transistor region B. To do this, anion injection mask other than that for the gate patterns 61 a is formed. That is, by using an additional mask during the formation of LDDs in the NMOS transistor region A, N-type impurities can be prevented from being injected into the PMOS transistor region B.

The formation technology of the LDD is widely used in order to prevent a hot carrier effect. The halos 69 are used in order to avoid a short channel effect. The haolsare formed by injecting impurities having an opposite type of that of the impurities injected to form the LDD. The use of an additional mask is the same as the case of forming the LDD.

In order to avoid the short channel effect by increasing the channel length, there are formed offset spacers 63 covering the sidewalls of the gate patterns 61a before forming the LDDs 67 and the halos 69. The offset spacers 63 are formed of an insulating layer having an etch selectivity with respect to the buffer layer patterns 59a and the sacrificial layer patterns 61. In one embodiment, the offset spacers 63 are formed of a silicon oxide ($SiO_2$) layer.

After the LDDs 67 and the halos 69 are formed, a conformal spacer insulating layer is formed on the semiconductor substrate having the gate patterns 61a. The spacer insulating layer is formed of an insulating layer having an etch selectivity with respect to the buffer layer patterns 59a and the sacrificial layer patterns 61. It may be formed of a silicon oxide ($SiO_2$) layer, and more preferably, it may be formed of multiple layers composed of at least two layers, which include a silicon oxide layer and a silicon nitride layer. The silicon nitride layer functions to prevent etch damage on the silicon oxide layer while subsequent processes such as a cleaning process of a native oxide layer are carried out.

The spacer insulating layer over the NMOS transistor region A and the PMOS transistor region B of the semiconductor substrate 51 is etched back to form spacers 65 for covering the sidewalls of the offset spacers 63.

High dose impurities are injected into the NMOS transistor region A and the PMOS transistor region B of the semiconductor substrate having the spacers 65 to form source/drain regions 71 (step 11 of FIG. 1). In the illustrated embodiment, N-type impurities are injected into the NMOS transistor region A and P-type impurities are injected into the PMOS transistor region B.

As shown in FIG. 3, in the case that the silicon layer 57 is not doped with impurities to control threshold voltages, the silicon patterns 57a are made to be doped with impurities during the process of injecting the high dose impurities, so as to control the threshold voltages.

The buffer layer patterns 59a and the sacrificial layer patterns 61 function as masks against injected ions, so that the injected ions are prevented from passing through the gate insulating layer patterns 55a and penetrating into the channel region.

Figure 6:
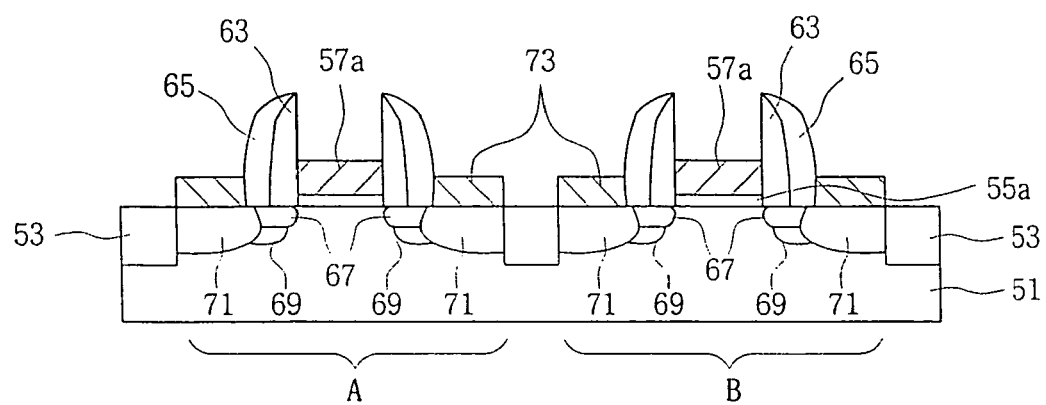

Referring to FIGS. 1 and 6, the sacrificial layer patterns 61 and the buffer layer patterns 59a are removed in order to expose the silicon patterns 57a in the NMOS transistor region A and the PMOS transistor region B in which the source/drain regions 71 are formed.

Selective epitaxial growth (SEG) layers 73 may be formed in the NMOS transistor region A and the PMOS transistor region B having the source/drain regions 71 before removing the sacrificial layer patterns 61 and the buffer layer patterns 59a. The SEG layers 73 function to alleviate silicon consumption in the source/drain regions 71 during a process of forming silicide layers.

Figure 7:
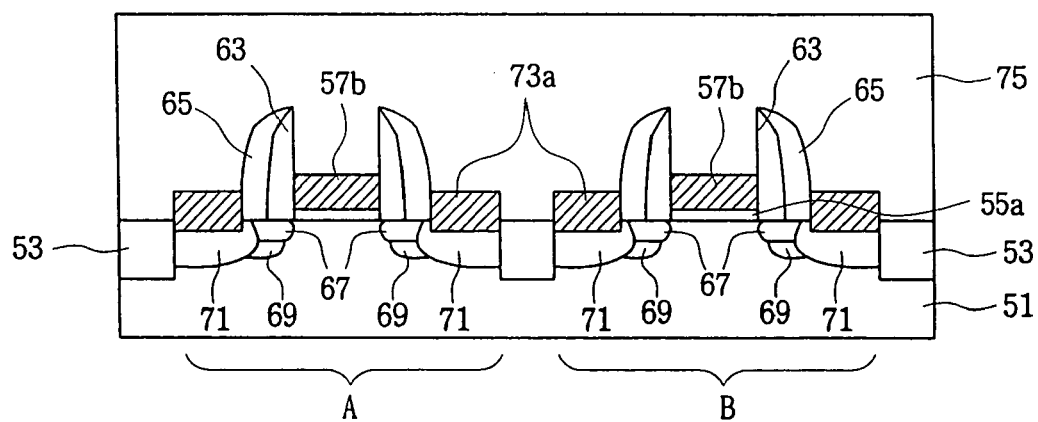

Referring to FIGS. 1 and 7, a metal layer is formed on the semiconductor substrate having the exposed silicon patterns 57a. As a result, the metal layer is formed on the exposed silicon patterns 57a. Further, the metal layer is formed on the surface of the source/drain regions 71.

The metal layer may be formed of one metal layer or at least one alloy layers selected from the group consisting of nickel (Ni) layer, cobalt (Co) layer, tungsten (W) layer, and titanium (Ti) layer. It may be formed of a nickel layer. The nickel layer may be a pure nickel layer or a nickel alloy layer. Herein, the nickel alloy layer may include tantalum (Ta), zirconium (Zr), titanium (Ti), hafnium (Hf), tungsten (W), cobalt (Co), platinum (Pt), palladium (Pd), vanadium (V), niobium (Nb) or a combination thereof.

The semiconductor substrate having the metal layer is annealed to form gate silicide layers 57b into which the exposed silicon patterns 57a are fully converted (step 13 of FIG. 1). In the case that the metal layer is a nickel layer, there can be formed a nickel silicide layer by annealing at a temperature of 400° C. to 530° C. in the presence of nitrogen. Herein, along with that, source/drain silicide layers 73a are formed at the surface of the source/drain regions.

Even though the gate silicide layers 57b and the source/drain silicide layers 73a are concurrently formed, junctions of the source/drain regions 71 are not broken down since the silicon patterns 57a are thin, Furthermore, in the case that the SEG layers 73 are formed on the source/drain regions 71, the SEG layers 73 react with the metal layer to form the silicide layer. Therefore, junction breakdown of the source/drain regions 71 can be avoided.

After the silicide layers 57b, 73a are formed, the unreacted portion of the metal layer remaining on the spacers 65 is removed such that the gate silicide layers 57b and the source/drain silicide layers 73a are electrically insulated. The unreacted portion of the metal layer remaining on top of the silicide layers 57b, 73a together is removed.

An interlayer insulating layer 75 is formed on the semiconductor substrate having the silicide layers 57b, 73a (step 15 of FIG. 1). In the case that the silicide layers 57b, 73a are nickel silicide layers, the interlayer insulating layer 75 is formed at a low temperature less than 550° C.

According to the present invention, a MOS transistor and a CMOS transistor can be provided through fabrication processes including a total gate silicidation process, in which source/drain silicide layers and a gate silicide layer are concurrently formed, and ions can be prevented from being injected into a channel region during an implantion of source/drain ions. Further, according to the present invention, there are provided a MOS transistor and a CMOS transistor being capable of maintaining a low threshold voltage even with a use of a metal gate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a MOS transistor comprising:
   a) forming an insulated gate pattern on a semiconductor substrate, the insulated gate pattern including a silicon pattern and a sacrificial layer pattern sequentially stacked, wherein forming the insulated gate pattern comprises sequentially forming a gate insulating layer and a silicon layer on the semiconductor substrate, forming a sacrificial layer on the semiconductor substrate having the silicon layer, doping the silicon layer with impurities to control a threshold voltage prior to formation of the sacrificial layer, and sequentially patterning the sacrificial layer and the silicon layer;
   b) forming spacers covering sidewalls of the gate pattern;
   c) injecting impurity ions into the semiconductor substrate using the spacers and the gate pattern as ion injection masks to form source/drain regions;
   d) removing the sacrificial layer pattern on the semiconductor substrate having the source/drain regions to expose the silicon pattern; and
   e) converting the exposed silicon pattern into a gate silicide layer, and concurrently selectively forming source/drain silicide layers at surfaces of the source/drain regions.

2. The method of claim 1, wherein the semiconductor substrate is one of a single crystal silicon substrate, a silicon-on-insulator (SOI) substrate, and a strained silicon substrate.

3. The method of claim 1, wherein the spacers are formed of an insulating layer having an etch selectivity with respect to the sacrificial layer pattern.

4. The method of claim 3, wherein the insulating layer having the etch selectivity is composed of multiple layers including a silicon oxide layer and a silicon nitride layer.

5. The method of claim 1, wherein converting the exposed silicon pattern into a gate silicide layer and concurrently forming source/drain silicide layers, comprises
   forming a metal layer on the semiconductor substrate having the exposed silicon pattern;
   annealing the metal layer until the exposed silicon pattern is silicided; and
   removing the unreacted portion of the metal layer remaining on the spacers.

6. The method of claim 5, wherein the metal layer comprises at least one metal layer comprising a metal selected from the group consisting of Ni, Co, W, and Ti.

7. The method of claim 5, wherein the metal layer comprises an alloy of a metal selected from the group consisting of Ni, Co, W, and Ti.

8. The method of claim 5, wherein the metal layer is one of a nickel layer and a nickel alloy layer.

9. The method of claim 1, further comprising forming a selective epitaxial growth layer on the source/drain regions before removing the sacrificial layer pattern.

10. The method of claim 1, further comprising forming a buffer layer on top of the silicon layer before doping the silicon layer, wherein the buffer layer is etched to form a buffer layer pattern before patterning the silicon layer, and the buffer layer pattern is removed along with the sacrificial layer pattern to expose the silicon pattern.

11. The method of claim 1, wherein the impurities to control the threshold voltage are N-type.

12. The method of claim 1, wherein the impurities to control the threshold voltage are P-type.

13. The method of claim 1, further comprising injecting impurity ions into the semiconductor substrate using the gate pattern as an ion injection mask to form an LDD and a halo prior to formation of the spacers.

14. The method of claim 13, further comprising forming offset spacers covering the sidewalls of the gate prior to formation of the LDD and the halo.

15. A method of fabricating a MOS transistor comprising:
   a) forming an insulated gate pattern on a semiconductor substrate, the insulated gate pattern including a silicon pattern and a sacrificial layer pattern sequentially stacked;
   b) forming spacers covering sidewalls of the gate pattern, impurity ions being injected into the semiconductor substrate using the gate pattern as an ion injection mask to form an LDD and a halo prior to formation of the spacers, and offset spacers being formed covering the sidewalls of the gate pattern prior to formation of the LDD and the halo;
   c) injecting impurity ions into the semiconductor substrate using the spacers and the gate pattern as ion injection masks to form source/drain regions;
   d) removing the sacrificial layer pattern on the semiconductor substrate having the source/drain regions to expose the silicon pattern; and
   e) converting the exposed silicon pattern into a gate silicide layer, and concurrently selectively forming source/drain silicide layers at surfaces of the source/drain regions.

16. The method of claim 15, wherein the semiconductor substrate is one of a single crystal silicon substrate, a silicon-on-insulator (SOI) substrate, and a strained silicon substrate.

17. The method of claim 15, wherein forming the insulated gate pattern comprises:
   sequentially forming a gate insulating layer and a silicon layer on the semiconductor substrate;
   forming a sacrificial layer on the semiconductor substrate having the silicon layer; and
   sequentially patterning the sacrificial layer and the silicon layer.

18. The method of claim 17, further comprising doping the silicon layer with impurities to control a threshold voltage prior to formation of the sacrificial layer.

19. The method of claim 18, further comprising forming a buffer layer on top of the silicon layer before doping the silicon layer, wherein the buffer layer is etched to form a buffer layer pattern before patterning the silicon layer, and the buffer layer pattern is removed along with the sacrificial layer pattern to expose the silicon pattern.

20. The method of claim 18, wherein the impurities to control the threshold voltage are N-type.

21. The method of claim 18, wherein the impurities to control the threshold voltage are P-type.

22. The method of claim 17, further comprising doping the silicon layer on top of the semiconductor substrate with impurities to control a threshold voltage.

23. The method of claim 15, wherein the spacers are formed of an insulating layer having an etch selectivity with respect to the sacrificial layer pattern.

24. The method of claim 23, wherein the insulating layer having the etch selectivity is composed of multiple layers including a silicon oxide layer and a silicon nitride layer.

25. The method of claim 15, wherein converting the exposed silicon pattern into a gate silicide layer and concurrently forming source/drain silicide layers, comprises:
   forming a metal layer on the semiconductor substrate having the exposed silicon pattern;
   annealing the metal layer until the exposed silicon pattern is silicided; and
   removing the unreacted portion of the metal layer remaining on the spacers.

26. The method of claim 25, wherein the metal layer comprises at least one metal layer comprising a metal selected from the group consisting of Ni, Co, W, and Ti.

27. The method of claim 25, wherein the metal layer comprises an alloy of a metal selected from the group consisting of Ni, Co, W, and Ti.

28. The method of claim 25, wherein the metal layer is one of a nickel layer and a nickel alloy layer.

29. The method of claim 15, further comprising forming a selective epitaxial growth layer on the source/drain regions before removing the sacrificial layer pattern.

30. A method of fabricating a MOS transistor comprising:
   a) forming an insulated gate pattern on a semiconductor substrate, the insulated gate pattern including a silicon pattern and a sacrificial layer pattern sequentially stacked;
   b) forming spacers covering sidewalls of the gate pattern;
   c) injecting impurity ions into the semiconductor substrate using the spacers and the gate pattern as ion injection masks to form source/drain regions;
   d) removing the sacrificial layer pattern on the semiconductor substrate having the source/drain regions to expose the silicon pattern, a selective epitaxial growth layer being formed on the source/drain regions before removing the sacrificial layer pattern; and
   e) converting the exposed silicon pattern into a gate silicide layer, and concurrently selectively forming source/drain silicide layers at surfaces of the source/drain regions.

31. The method of claim 30, wherein the semiconductor substrate is one of a single crystal silicon substrate, a silicon-on-insulator (SOI) substrate, and a strained silicon substrate.

32. The method of claim 30, wherein forming the insulated gate pattern comprises:
   sequentially forming a gate insulating layer and a silicon layer on the semiconductor substrate;
   forming a sacrificial layer on the semiconductor substrate having the silicon layer; and
   sequentially patterning the sacrificial layer and the silicon layer.

33. The method of claim 32, further comprising doping the silicon layer with impurities to control a threshold voltage prior to formation of the sacrificial layer.

34. The method of claim 33, further comprising forming a buffer layer on top of the silicon layer before doping the silicon layer, wherein the buffer layer is etched to form a buffer layer pattern before patterning the silicon layer, and the buffer layer pattern is removed along with the sacrificial layer pattern to expose the silicon pattern.

35. The method of claim 33, wherein the impurities to control the threshold voltage are N-type.

36. The method of claim 33, wherein the impurities to control the threshold voltage are P-type.

37. The method of claim 30, further comprising doping the silicon layer on top of the semiconductor substrate with impurities to control a threshold voltage.

38. The method of claim 30, further comprising injecting impurity ions into the semiconductor substrate using the gate pattern as an ion injection mask to form an LDD and a halo prior to formation of the spacers.

39. The method of claim 38, further comprising forming offset spacers covering the sidewalls of the gate pattern prior to formation of the LDD and the halo.

40. The method of claim 30, wherein the spacers are formed of an insulating layer having an etch selectivity with respect to the sacrificial layer pattern.

41. The method of claim 40, wherein the insulating layer having the etch selectivity is composed of multiple layers including a silicon oxide layer and a silicon nitride layer.

42. The method of claim 30, wherein converting the exposed silicon pattern into a gate silicide layer and concurrently forming source/drain silicide layers, comprises
   forming a metal layer on the semiconductor substrate having the exposed silicon pattern;
   annealing the metal layer until the exposed silicon pattern is silicided; and
   removing the unreacted portion of the metal layer remaining on the spacers.

43. The method of claim 42, wherein the metal layer comprises at least one metal layer comprising a metal selected from the group consisting of Ni, Co, W, and Ti.

44. The method of claim 42, wherein the metal layer comprises an alloy of a metal selected from the group consisting of Ni, Co, W, and Ti.

45. The method of claim 42, wherein the metal layer is one of a nickel layer and a nickel alloy layer.

46. A method of fabricating a CMOS transistor comprising:
   a) defining an NMOS transistor region and a PMOS transistor region on a predetermined portion of a semiconductor substrate;
   b) forming insulated gate patterns on the NMOS transistor region and the PMOS transistor region, each of the insulated gate patterns including a silicon pattern and a sacrificial layer pattern sequentially stacked, wherein the step of forming the insulated gate patterns comprises sequentially forming a gate insulating layer and a silicon layer on the semiconductor substrate, forming a sacrificial layer on the semiconductor substrate having the silicon layer, the silicon layer on the upper portion of the NMOS transistor region and the PMOS transistor region being doped with impurities to control threshold voltages prior to formation of the sacrificial layer, and patterning the sacrificial layer and the silicon layer;
   c) forming spacers covering sidewalls of the gate patterns;
   d) injecting impurity ions into the NMOS transistor region and the PMOS transistor region using the gate patterns and the spacers as ion injection masks to form source/drain regions;
   e) removing the sacrificial layer patterns on the semiconductor substrate having the source/drain regions to expose the silicon patterns; and
   f) converting the exposed silicon patterns into gate silicide layers, and concurrently selectively forming source/drain silicide layers at surfaces of the source/drain regions.

47. The method of claim 46, wherein the semiconductor substrate is one of a single crystal silicon substrate, a silicon-on-insulator (SOI) substrate, and a strained silicon substrate.

48. The method of claim 46, further comprising forming offset spacers covering the sidewalls of the gate patterns prior to formation of the LDDs and the halos.

49. The method of claim 46, wherein the spacers are formed of an insulating layer having an etch selectivity with respect to the sacrificial layer patterns.

50. The method of claim 49, wherein the insulating layer having the etch selectivity is composed of multiple layers including a silicon oxide layer and a silicon nitride layer.

51. The method of claim 46, wherein converting the exposed silicon patterns into gate silicide layers and concurrently selectively forming source/drain silicide layers, comprises:
   i) forming a metal layer on the semiconductor substrate having the exposed silicon patterns;
   ii) annealing the metal layer until the exposed silicon patterns are silicided; and
   iii) removing the unreacted portion of the metal layer remaining on the spacers.

52. The method of claim 51, wherein the metal layer is at least one metal layer comprising a metal selected from the group consisting of Ni, Co, W, and Ti.

53. The method of claim 51, wherein the metal layer comprises an alloy comprising a metal selected from the group consisting of Ni, Co, W, and Ti.

54. The method of claim 51, wherein the metal layer is a nickel layer or a nickel alloy layer.

55. The method of claim 46, further comprising forming a selective epitaxial growth layer on the source/drain regions before removing the sacrificial layer pattern.

56. The method of claim 46, further comprising forming a buffer layer on top of the silicon layer before doping the silicon layer, wherein the buffer layer is etched to form buffer layer patterns before patterning the silicon layer, and the buffer layer patterns are removed along with the sacrificial layer patterns in order to expose the silicon patterns.

57. The method of claim 46, wherein the impurities for doping the silicon layer on the upper portion of the NMOS transistor region and the PMOS transistor region to control the threshold voltages are N-type and P-type, respectively.

58. The method of claim 46, further comprising injecting impurity ions into the NMOS transistor region and the PMOS transistor region on the semiconductor substrate using the gate patterns as an ion injection mask to form LDDs and halos prior to formation of the spacers.

59. A method of fabricating a CMOS transistor comprising:
   a) defining an NMOS transistor region and a PMOS transistor region on a predetermined portion of a semiconductor substrate;
   b) forming insulated gate patterns on the NMOS transistor region and the PMOS transistor region, each of the insulated gate patterns including a silicon pattern and a sacrificial layer pattern sequentially stacked, wherein the step of forming the insulated gate patterns comprises sequentially forming a gate insulating layer and a silicon layer on the semiconductor substrate, forming a sacrificial layer on the semiconductor substrate having the silicon layer, doping the silicon layer on the upper portion of the NMOS transistor region and the PMOS transistor region on the semiconductor substrate having the sacrificial layer with impurities to control threshold voltages, and patterning the sacrificial layer and the silicon layer;
   c) forming spacers covering sidewalls of the gate patterns;
   d) injecting impurity ions into the NMOS transistor region and the PMOS transistor region using the gate patterns and the spacers as ion injection masks to form source/drain regions;
   e) removing the sacrificial layer patterns on the semiconductor substrate having the source/drain regions to expose the silicon patterns; and f) converting the exposed silicon patterns into gate silicide layers, and concurrently selectively forming source/drain silicide layers at surfaces of the source/drain regions.

60. The method of claim 59, wherein the semiconductor substrate is one of a single crystal silicon substrate, a silicon-on-insulator (SOI) substrate, and a strained silicon substrate.

61. The method of claim 59, further comprising forming a buffer layer on top of the silicon layer, wherein the buffer layer is etched to form buffer layer patterns before patterning the silicon layer, and the buffer layer patterns are removed along with the sacrificial layer patterns in order to expose the silicon patterns.

62. The method of claim 59, further comprising injecting impurity ions into the NMOS transistor region and the PMOS transistor region on the semiconductor substrate using the gate patterns as an ion injection mask to form LDDs and halos prior to formation of the spacers.

63. The method of claim 59, further comprising forming offset spacers covering the sidewalls of the gate patterns prior to formation of the LDDs and the halos.

64. The method of claim 59, wherein the spacers are formed of an insulating layer having an etch selectivity with respect to the sacrificial layer patterns.

65. The method of claim 64, wherein the insulating layer having the etch selectivity is composed of multiple layers including a silicon oxide layer and a silicon nitride layer.

66. The method of claim 59, wherein converting the exposed silicon patterns into gate silicide layers and concurrently selectively forming source/drain silicide layers, comprises:
i) forming a metal layer on the semiconductor substrate having the exposed silicon patterns;
ii) annealing the metal layer until the exposed silicon patterns are silicided; and
iii) removing the unreacted portion of the metal layer remaining on the spacers.

67. The method of claim 66, wherein the metal layer is at least one metal layer comprising a metal selected from the group consisting of Ni, Co, W, and Ti.

68. The method of claim 66, wherein the metal layer comprises an alloy comprising a metal selected from the group consisting of Ni, Co, W, and Ti.

69. The method of claim 66, wherein the metal layer is a nickel layer or a nickel alloy layer.

70. The method of claim 59, further comprising forming a selective epitaxial growth layer on the source/drain regions before removing the sacrificial layer pattern.

71. A method of fabricating a CMOS transistor comprising:
a) defining an NMOS transistor region and a PMOS transistor region on a predetermined portion of a semiconductor substrate;
b) forming insulated gate patterns on the NMOS transistor region and the PMOS transistor region, each of the insulated gate patterns including a silicon pattern and a sacrificial layer pattern sequentially stacked;
c) forming spacers covering sidewalls of the gate patterns, impurity ions being injected into the NMOS transistor region and the PMOS transistor region on the semiconductor substrate using the gate patterns as an ion injection mask to form LDDs and halos prior to formation of the spacers, and offset spacers being formed covering the sidewalls of the gate patterns prior to formation of the LDDs and the halos;
d) injecting impurity ions into the NMOS transistor region and the PMOS transistor region using the gate patterns and the spacers as ion injection masks to form source/drain regions;
e) removing the sacrificial layer patterns on the semiconductor substrate having the source/drain regions to expose the silicon patterns; and
f) converting the exposed silicon patterns into gate silicide layers, and concurrently selectively forming source/drain silicide layers at surfaces of the source/drain regions.

72. The method of claim 71, wherein the semiconductor substrate is one of a single crystal silicon substrate, a silicon-on-insulator (SOI) substrate, and a strained silicon substrate.

73. The method of claim 71, wherein the step of forming the gate patterns comprises:
sequentially forming a gate insulating layer and a silicon layer on the semiconductor substrate;
forming a sacrificial layer on the semiconductor substrate having the silicon layer; and
patterning the sacrificial layer and the silicon layer.

74. The method of claim 73, further comprising doping the silicon layer on the upper portion of the NMOS transistor region and the PMOS transistor region with impurities to control threshold voltages prior to formation of the sacrificial layer.

75. The method of claim 73, further comprising forming a buffer layer on top of the silicon layer before doping the silicon layer, wherein the buffer layer is etched to form buffer layer patterns before patterning the silicon layer, and the buffer layer patterns are removed along with the sacrificial layer patterns in order to expose the silicon patterns.

76. The method of claim 74, wherein the impurities for doping the silicon layer on the upper portion of the NMOS transistor region and the PMOS transistor region to control the threshold voltages are N-type and P-type, respectively.

77. The method of claim 73, further comprising doping the silicon layer on the upper portion of the NMOS transistor region and the PMOS transistor region on the semiconductor substrate having the sacrificial layer with impurities to control threshold voltages.

78. The method of claim 71, wherein the spacers are formed of an insulating layer having an etch selectivity with respect to the sacrificial layer patterns.

79. The method of claim 78, wherein the insulating layer having the etch selectivity is composed of multiple layers including a silicon oxide layer and a silicon nitride layer.

80. The method of claim 71, wherein converting the exposed silicon patterns into gate silicide layers and concurrently selectively forming source/drain silicide layers, comprises:
i) forming a metal layer on the semiconductor substrate having the exposed silicon patterns;
ii) annealing the metal layer until the exposed silicon patterns are silicided; and
iii) removing the unreacted portion of the metal layer remaining on the spacers.

81. The method of claim 80, wherein the metal layer is at least one metal layer comprising a metal selected from the group consisting of Ni, Co, W, and Ti.

82. The method of claim 80, wherein the metal layer comprises an alloy comprising a metal selected from the group consisting of Ni, Co, W, and Ti.

83. The method of claim 80, wherein the metal layer is a nickel layer or a nickel alloy layer.

84. The method of claim 71, further comprising forming a selective epitaxial growth layer on the source/drain regions before removing the sacrificial layer pattern.

85. A method of fabricating a CMOS transistor comprising:
   a) defining an NMOS transistor region and a PMOS transistor region on a predetermined portion of a semiconductor substrate;
   b) forming insulated gate patterns on the NMOS transistor region and the PMOS transistor region, each of the insulated gate patterns including a silicon pattern and a sacrificial layer pattern sequentially stacked;
   c) forming spacers covering sidewalls of the gate patterns;
   d) injecting impurity ions into the NMOS transistor region and the PMOS transistor region using the gate patterns and the spacers as ion injection masks to form source/drain regions;
   e) removing the sacrificial layer patterns on the semiconductor substrate having the source/drain regions to expose the silicon patterns, a selective epitaxial growth layer being formed on the source/drain regions before removing the sacrificial layer pattern; and
   f) converting the exposed silicon patterns into gate silicide layers, and concurrently selectively forming source/drain silicide layers at surfaces of the source/drain regions.

86. The method of claim 85, wherein the semiconductor substrate is one of a single crystal silicon substrate, a silicon-on-insulator (SOI) substrate, and a strained silicon substrate.

87. The method of claim 85, wherein the step of forming the gate patterns comprises:
   sequentially forming a gate insulating layer and a silicon layer on the semiconductor substrate;
   forming a sacrificial layer on the semiconductor substrate having the silicon layer; and
   patterning the sacrificial layer and the silicon layer.

88. The method of claim 87, further comprising doping the silicon layer on the upper portion of the NMOS transistor region and the PMOS transistor region with impurities to control threshold voltages prior to formation of the sacrificial layer.

89. The method of claim 88, further comprising forming a buffer layer on top of the silicon layer before doping the silicon layer, wherein the buffer layer is etched to form buffer layer patterns before patterning the silicon layer, and the buffer layer patterns are removed along with the sacrificial layer patterns in order to expose the silicon patterns.

90. The method of claim 88, wherein the impurities for doping the silicon layer on the upper portion of the NMOS transistor region and the PMOS transistor region to control the threshold voltages are N-type and P-type, respectively.

91. The method of claim 87, further comprising doping the silicon layer on the upper portion of the NMOS transistor region and the PMOS transistor region on the semiconductor substrate having the sacrificial layer with impurities to control threshold voltages.

92. The method of claim 85, further comprising injecting impurity ions into the NMOS transistor region and the PMOS transistor region on the semiconductor substrate using the gate patterns as an ion injection mask to form LDDs and halos prior to formation of the spacers.

93. The method of claim 85, further comprising forming offset spacers covering the sidewalls of the gate patterns prior to formation of the LDDs and the halos.

94. The method of claim 85, wherein the spacers are formed of an insulating layer having an etch selectivity with respect to the sacrificial layer patterns.

95. The method of claim 94, wherein the insulating layer having the etch selectivity is composed of multiple layers including a silicon oxide layer and a silicon nitride layer.

96. The method of claim 85, wherein converting the exposed silicon patterns into gate silicide layers and concurrently selectively forming source/drain silicide layers, comprises:
   i) forming a metal layer on the semiconductor substrate having the exposed silicon patterns;
   ii) annealing the metal layer until the exposed silicon patterns are silicided; and
   iii) removing the unreacted portion of the metal layer remaining on the spacers.

97. The method of claim 96, wherein the metal layer is at least one metal layer comprising a metal selected from the group consisting of Ni, Co, W, and Ti.

98. The method of claim 96, wherein the metal layer comprises an alloy comprising a metal selected from the group consisting of Ni, Co, W, and Ti.

99. The method of claim 96, wherein the metal layer is a nickel layer or a nickel alloy layer.

* * * * *